United States Patent [19]

Pollack et al.

[11] Patent Number: 4,939,104

[45] Date of Patent: * Jul. 3, 1990

[54] METHOD FOR FORMING A BURIED LATERAL CONTACT

[75] Inventors: Gordon P. Pollack, Richardson; Donald M. Bordelon, Garland; William F. Richardson, Richardson; Satwinder S. Malhi, Garland, all of Tex.

[73] Assignee: Texas Instruments, Incorporated, Dallas, Tex.

[*] Notice: The portion of the term of this patent subsequent to Jan. 10, 2006 has been disclaimed.

[21] Appl. No.: 122,604

[22] Filed: Nov. 17, 1987

Related U.S. Application Data

[63] Continuation of Ser. No. 799,048, Nov. 18, 1985, abandoned, which is a continuation-in-part of Ser. No. 666,715, Oct. 31, 1984, abandoned.

[51] Int. Cl.$^5$ .......................................... H01L 21/225
[52] U.S. Cl. .................................... 437/162; 437/203; 437/52
[58] Field of Search ............... 437/160, 161, 162, 52, 437/31, 203, 233; 156/657

[56] References Cited

U.S. PATENT DOCUMENTS

| | | | |
|---|---|---|---|
| 4,261,765 | 4/1981 | Komatsu et al. | 437/160 |
| 4,483,726 | 11/1984 | Isaac et al. | 437/31 |
| 4,669,176 | 6/1987 | Kato | 437/160 |
| 4,738,936 | 4/1988 | Rice | 437/141 |
| 4,797,373 | 1/1989 | Malhi et al. | 437/60 |
| 4,824,793 | 4/1989 | Richardson et al. | 437/47 |

FOREIGN PATENT DOCUMENTS

| | | | |
|---|---|---|---|
| 59-32168 | 2/1984 | Japan | 437/162 |
| 62-208671 | 9/1987 | Japan | 437/31 |

Primary Examiner—Olik Chaudhuri
Attorney, Agent, or Firm—Rodney M. Anderson; Douglas A. Sorensen; Melvin Sharp

[57] ABSTRACT

The present invention is described in conjunction with the fabrication of a dRAM cell which an important application of the present invention. The described cell provides a one-transistor/one-capacitor dRAM cell structure and array in which the cell transistor is formed on the sidewalls of a substrate trench containing the cell capacitor; the word and bit lines cross over this trench. This stacking of the transistor on top of the capacitor yields a cell with minimal area on the substrate and solves a problem of dense packing of cells.

One capacitor plate and the transistor channel and source region are formed in the bulk sidewall of the trench and the transistor gate and the other plate of the capacitor are both formed in polysilicon in the trench but separated from each other by an oxide layer inside the trench. The signal charge is stored on the polysilicon capacitor plate by an electrical connection of the source region with the polysilicon capacitor plate, which is provided by the described embodiment of the invention.

Another embodiment of the present invention is an interconnection between a surface conductor and the surface of the substrate. This embodiment uses a conductive plug formed between the conductor and the substrate to form an interconnection using a minimum of surface area of the substrate.

6 Claims, 7 Drawing Sheets

METHOD FOR FORMING A BURIED LATERAL CONTACT

RELATED APPLICATIONS

This application is a continuation of application Ser. No. 06/799,048, filed 11/18/85, now abandoned, which is a continuation-in-part of Ser. No. 666,715 filed Oct. 31, 1984, now abandoned.

FIELD OF THE INVENTION

The present invention relates to the field of integrated circuit fabrication methods. More specifically, the present invention relates to methods for forming connections to circuit components formed in deeply etched trenches in integrated circuitry.

BACKGROUND OF THE INVENTION

It is widely known in the art that metal-oxide semiconductor (MOS) capacitors provide superior performance over other capacitor structures in integrated circuitry. One area where MOS capacitors are superior is in charge integrity when the capacitor is struck by an alpha particle. This is particularly important in dynamic random access memories(dRAMs). Alteration of the charge on the storage capacitor in a dRAM cell causes an error in the data stored. This is one form of soft error and is a widely recognized problem. MOS capacitors are less susceptible to soft errors because the alpha particle must impart MOS capacitors are less susceptible to soft errors because the alpha particle must impart enough energy to an electron to bring the electron up to the conduction band of the oxide, which is very high.

One recently developed embodiment of an MOS capacitor is the trench capacitor. This capacitor is formed by etching a cavity in the surface of a substrate (the trench), forming an insulator on the sides of the trench and filling the trench with a conductive material. One plate of the capacitor is formed by the conductive material in the trench, and the other by the substrate. In order to provide the above mentioned soft error characteristic, the charge must be stored on the inner conductive layer which is electrically isolated from the substrate by the insulator. Electrical contact to the conductive layer can be made at the top of the trench by the usual integrated circuit interconnect techniques. However, a better method for contacting the conductive layer allows the use of the upper portion of the trench for other purposes. This is one advantage of the present invention.

Figure 1:
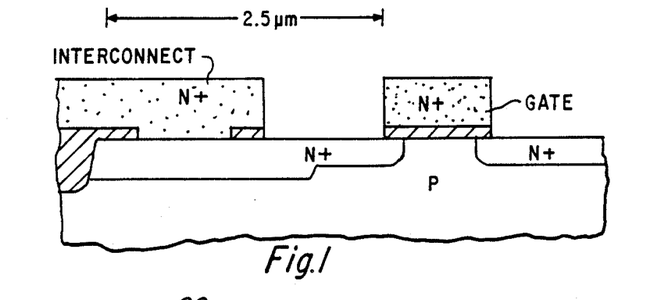
FIG. 1 is a side view schamatic diagram of a prior art interconnection between a surface conductor and a diffusion in a substrate.

Another problem involving the fabrication of integrated circuitry is minimization of the surface area required for particular components. FIG. 1 is a sideview schematic diagram depicting a prior art interconnection between a first level polycrystalline silicon interconnect and the source/drain region 6 of a field effect transistor. As indicated in FIG. 2, the necessary spacing required for this interconnect is approximately 2.5 microns. One micron is required each for spacing between the interconnect and the gate and for the opening between the insulator beneath the interconnect and the source/drain region. Another 0.5 microns is required for registration errors.

SUMMARY OF THE INVENTION

The present invention is described in conjunction with the fabrication of a dRAM cell which is an important application of the present invention. The described cell provides a one-transistor/one-capacitor dRAM cell structure and array in which the cell pass transistor is formed on the sidewalls of a substrate trench containing the cell capacitor; the word and bit lines cross over this trench. This stacking of the transistor on top of the capacitor yields a cell with minimal area on the substrate and solves a problem of dense packing of cells.

One capacitor plate and the transistor channel and source region are formed in the bulk sidewall of the trench, and the transistor gate and the other plate of the capacitor are both formed in polysilicon in the trench but separated from each other by an oxide layer inside the trench. The signal charge is transferred to the polysilicon capacitor plate by an electrical connection of the source region of the vertical pass transistor with the polysilicon capacitor plate. This connection between source and polysilicon capacitor plate is provided by the described embodiment of the invention which is termed a buried lateral contact.

Another embodiment of the present invention is an interconnection between a surface conductor and the surface of the substrate. This embodiment uses a conductive plug formed between the conductor and the substrate to form an interconnection using a minimum of surface area of the substrate.

DESCRIPTION OF THE PREFERRED EMBODIMENTS

Figure 2A:
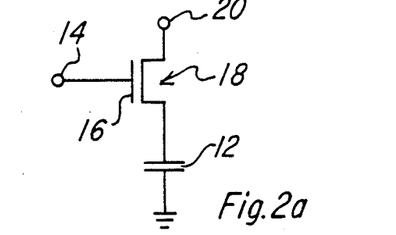
FIGS. 2A and 2B are the schematic equivalent circuit and local memory arry geometry for preferred embodiment dRAM cells.

The preferred embodiment dRAM cells are one transistor/one capacitor cells connected to bit and word lines as shown in schematic FIG. 2A and operate as follows. Capacitor 12 stores charge to represent a bit of information (for example, no stored charge could represent a logic 0 and the stored charge corresponding to a potential of 5 volts across the capacitor plates could represent a logic 1). The bit of information is accessed (to read or to write a new bit) by applying a voltage on word line 14 connected to gate 16 to turn ON transistor 18; a turned ON transistor 18 connects capacitor 12 to bit line 20 for the read or write operation. Leakage currents and other sources of decay of the charge on capacitor 12 necessitate periodic refreshing of the charge, and thus the name dynamic RAM (dRAM).

Figure 2B:
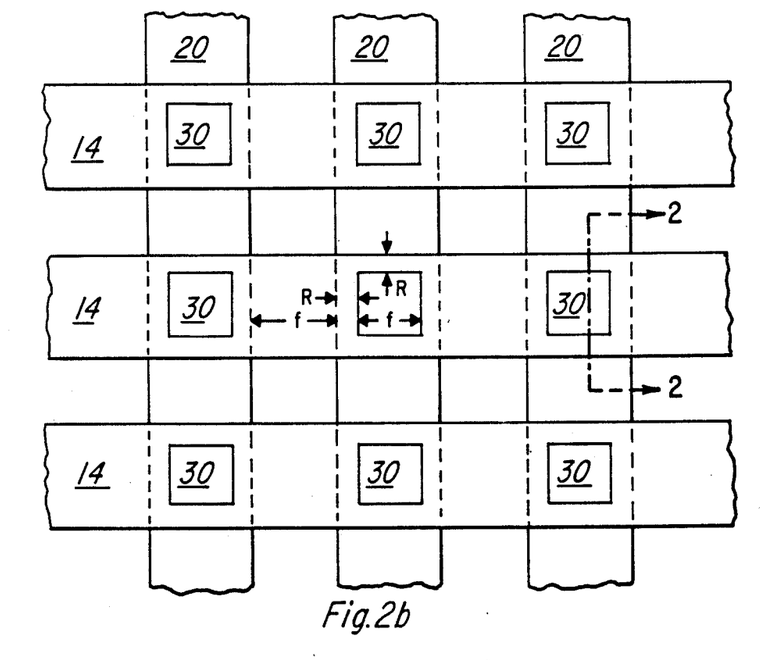
Figure 3:
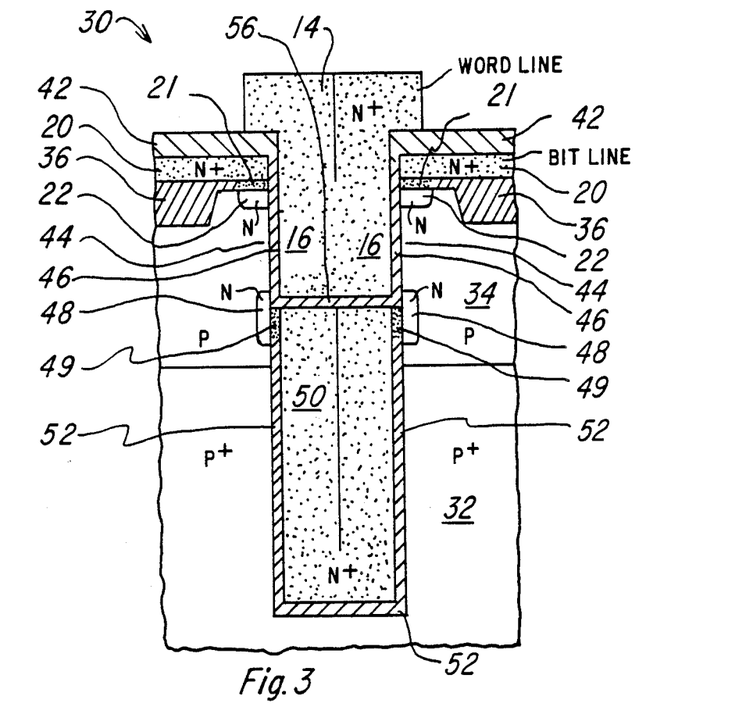
FIG. 3 is a schematic cross sectional elevation of a first preferred embodiment dRAM cell taken along line 2—2 of FIG. 2B.

FIG. 2B is a plan view showing a portion of a dRAM array of bit lines 20 and word lines 14 with preferred embodiment cells 30 at the intersections of the lines; note that bit lines 20 pass under word lines 14. The cells extend down into the substrate below the lines and provide a maximal density memory. If the minimum feature size is denoted by f and the minimum registration is denoted by R, then the cell area is [2(f+R)]2. For example, with a minimum feature size of 1.0 micron and a minimum registration tolerance of 0.25 micron, the cell area is about 6.25 square microns. FIG. 3 is a cross-sectional view of the first preferred embodiment dRAM cell, generally denoted 30. Cell 30 is formed in p+ silicon substrate 32 with p epilayer 34 and includes n+ polysilicon bit line 20, bit line insulating nitride 42, field oxide 36, n+ polysilicon word line 14, transistor 18, channel 44, transistor 18, gate oxide 46, n diffused region 48 which forms the source for transistor 18, n+ polysilicon region 50 which forms one of the plates of capacitor 12 with p+ substrate 32 forming the other and ground plate, oxide 52 which forms the insulator between the plates of capacitor 12, insulating oxide 56 which separates word line 14 from capacitor plate 50, n diffused region 22 which forms the drain of transistor 18, n polysilicon region 21 which connects bit line 20 with drain region 22, and n polysilicon region 49 which connects source 48 with n+ capacitor plate 50. Gate 16 of transistor 18 is simply that portion of word line 14 that is across gate oxide 46 from channel region 44. The view of cell 30 in FIG. 3 corresponds to a section along vertical line 2—2 in FIG. 2B; the square cross section of the trench containing capacitor 12 and transistor 18 is apparent in FIG. 2B.

In cell 30 capacitor 12 is formed with one of its plates being n+ region 50 together with n region 48 and the other plate being substrate 32 together with epilayer 34; however, the doping of epilayer 34 is much lower than that of p+ substrate 32 so the capacitance of the n/p junction of region 48 and epilayer 34 and the capacitance of n+ region 50/oxide 52/p epilayer 34 are both much less than the capacitance of n+ region 50/oxide 52/p+ substrate 32 and may be ignored. Also, as will be detailed below, the plate area of epilayer 34 is small compared to that of substrate 32, and this further makes insignificant the capacitance associated with epilayer 34. Consequently, the bulk of the charge stored by capacitor 12 is isolated from substrate 32 (and epilayer 34) by oxide 52. For a trench with a one micron by one micron cross section and six micron depth, the capacitor 12 plate area would be about 21 square microns if one micron of the depth is epilayer 34 and bit line 20. P+ substrate 32 is the ground common to all cells 30 in an array.

Transistor 18 in cell 30 is entirely in bulk silicon with a polysilicon gate; channel region 44 is part of p epilayer 34, source region 48 (which is also a part of a plate of capacitor 12) and drain region 22 are n diffusions in p epilayer 34, gate oxide 46 is grown on the trench surface of p epilayer 34, and gate 16 is part of polysilicon word line 14. Field oxide 36 is fairly thick and minimizes the capacitance of bit line 20.

The dimensions and materials characteristic of cell 30 are best understood in connection with the following description of a first preferred embodiment method of fabrication; FIGS. 4A through 4G illustrate the sequence of process steps.

1. (100) oriented p+ silicon substrate 32 of resistivity less than 1E-2 ohm-cm has p epilayer 34 grown with a carrier concentration of $2 \times 10^{16}/cm^3$ and thickness such that after all thermal processing the final p epilayer thickness is two microns. Field oxide 36 (including protective oxide 37) is formed by standard processing. As an example, SWAMI process may be used (grow stress relief oxide, deposit low pressure chemical vapor deposition (LPCVD) nitride, pattern and plasma etch the nitride-oxide-silicon, boron implant for channel stops, grow second stress relief oxide, deposit second nitride, deposit LPCVD oxide, plasma etch LPCVD oxide-nitride, wet etch filaments of LPCVD oxide remaining from previous etch, thermally grow field oxide to yield an approximately planar structure, and strip the nitrides). Regardless of the method usesd, the final thickness of field oxide 36 is 5000A and protective oxide 37 is about 200A thick. 2000A of polysilicon 20 is deposited by LPCVD, doped to a carrier concentration of $1 \times 10^{20}/cm^3$, and patterned and etched to form bit lines 20. Optionally an n+ diffused bitline can be substituted for the polysilicon bitline. Next, 10,000A of nitride 42 is deposited by LPCVD; see FIG. 4A. A layer composed of deposited nitride and oxide could also be used for layer 42.

2. Nitride 42 is patterned to define the one micron square trenches. The patterned nitride 42 is then used as the mask for reactive ion etching (RIE) with hydrochloric acid excavation of the trenches to a depth of 8 microns. The trench walls are cleaned of RIE damage and contamination with a wet acid etch; see FIG. 4B. Note that oxide 42 is also partially removed by the RIE.

3. Oxide 52 is grown to a thickness of 200A on the trench walls and bottom. The trench is then filled with n+ doped polysilicon as part of a deposition of 7000A of n+ polysilicon by LPCVD; see FIG. 4C.

4. Polysilicon 50 is planarized, such as with spun on photoresist, and etched completely away on the surface and down into the trench to about 3000A above the epilayer 34/substrate 32 interface; see FIG. 4D. As will be seen below, the location of the top of the remaining polysilicon 50 in the trench will approximately determine the bottom of the channel of transistor 18. Note that nitride layer 42 is further eroded by the plasma etch but is still at least 2000A thick.

5. The exposed portion to oxide 52 is etched, and this etching is continued to overetch 1000 to 2000A of oxide. This overetch removes the top portion of oxide 52 between epilayer 34 and polysilicon 50 to a depth of 1000 to 2000A, as indicated by arrows 53 in FIG. 4E; and also removes 1000 to 2000A of protective oxide 37 between epilayer 34 and bit line 20, as indicated by arrows 39 in FIG. 4E. This overetch in effect is forming two small annular crevices, each with a depth of 1000 to 2000A and a width of 200A; one of these small crevices girdles the top portion of polysilicon 50 as indicated by arrows 53, and the other of these small crevices runs horizontally around the boundary of bit line 20 as indicated by arrows 39.

Figure 4A:
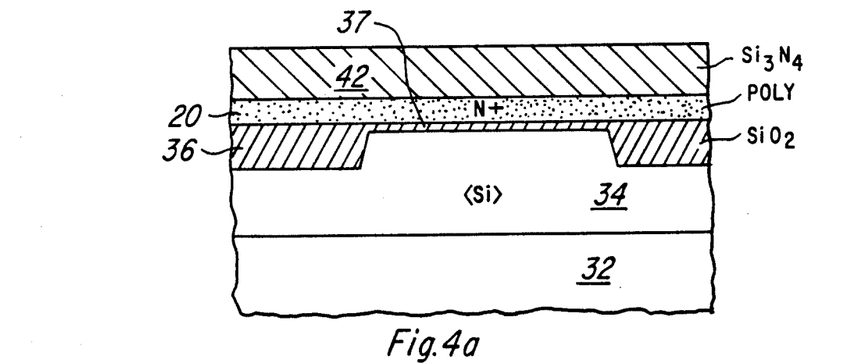
FIGS. 4A through 4G illustrate a sequence of process steps for fabrication of one embodiment of a memory cell including the present invention by a method which is another embodiment of the present invention.
Figure 4B:
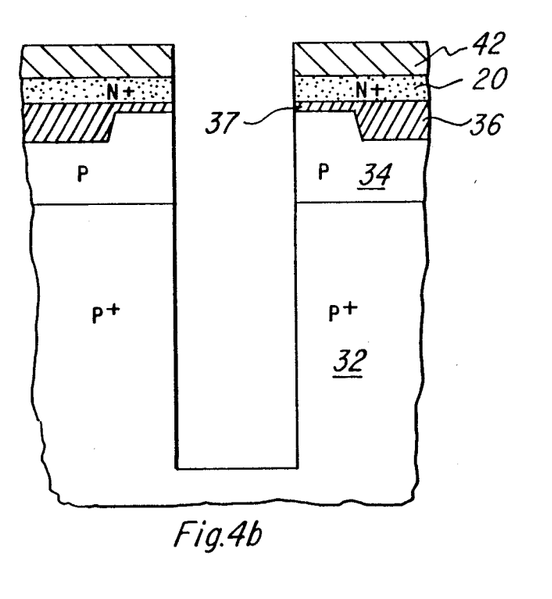
Figure 4C:
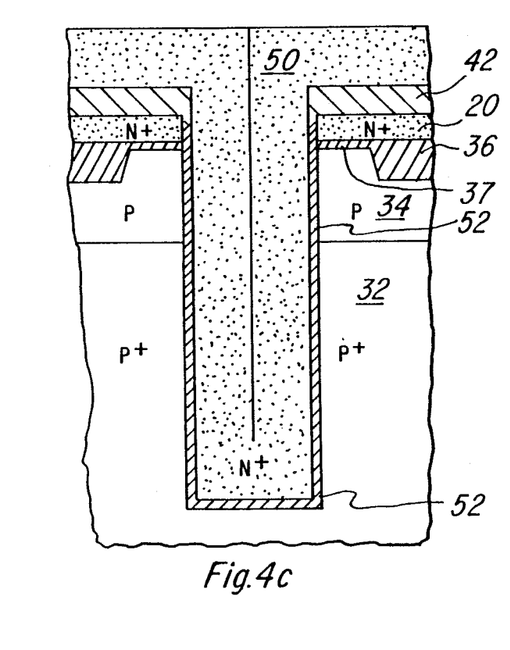
Figure 4D:
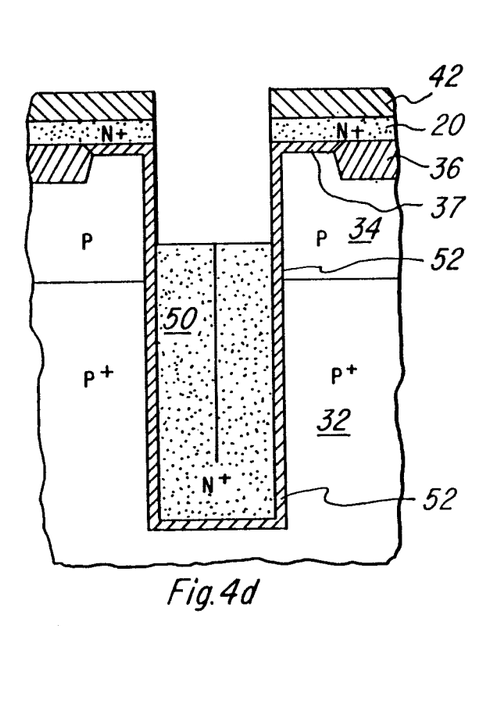
Figure 4E:
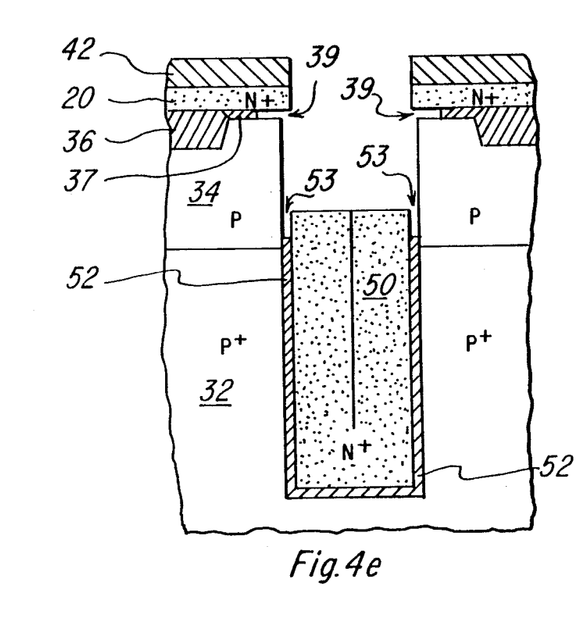
Figure 4F:
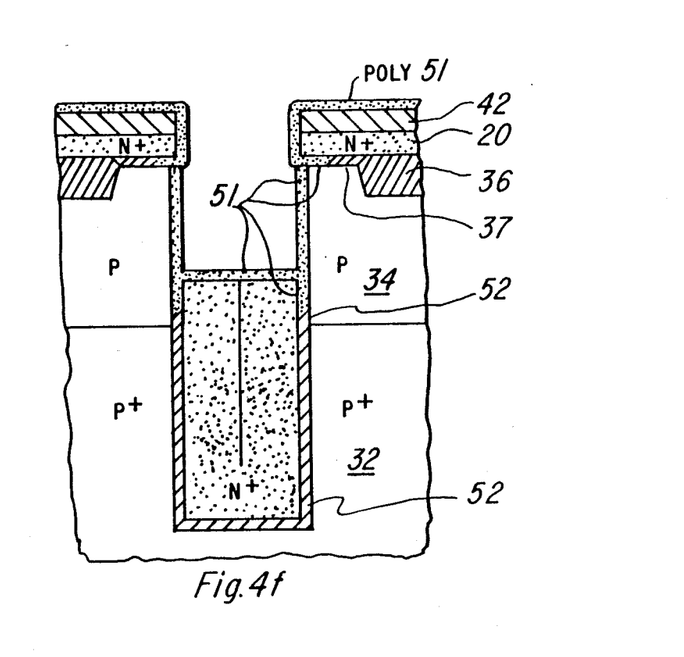
Figure 4G:
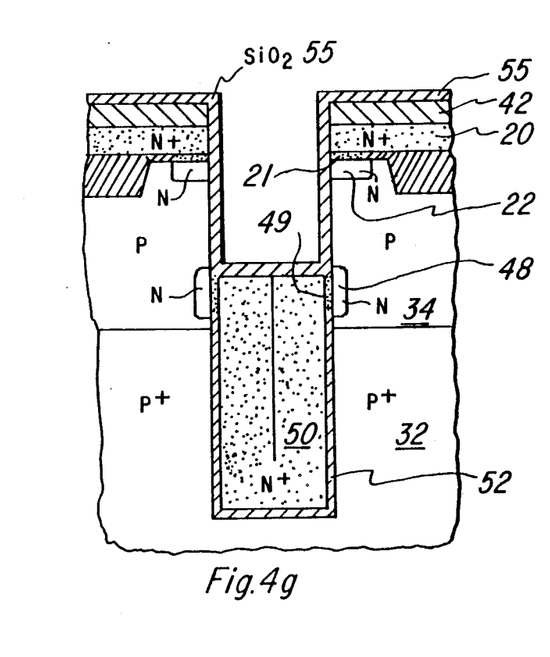

6. 500A of polysilicon 51 is deposited by LPCVD, this is sufficient thickness to insure that the small crevices indicated by arrows 53 and 39 in FIG. 4E are filled; see FIG. 4F.

7. 500A of oxide 55 is thermally grown, this is just enough oxidation to oxidize all of polysilicon 51 except for that portion in the small crevices indicated by arrows 53 and 39 in FIG. 4E, which are too far from the oxidizing interface. This amount of oxidation also consumes very little of epilayer 34. The high temperatures of the thermal oxidation of polysilicon 51 causes the dopant in n+ polysilicon 50 to diffuse through the polysilicon 51 in the small crevice indicated by arrows 53 and into p epilayer 34; this diffusion of dopants forms n type polysilicon region 49 and n type region 48 in p epilayer 34; see FIG. 4G. Further, a similar diffusion of dopants from bit line 20 through the polysilicon in the small crevice indicated by arrows 39 and into epilayer 34 forms n polysilicon region 21 and n type region 22 in epilayer 34; see FIG. 4G. As an option, the 500A of polysilicon 51 can be removed by a timed wet chemical silicon etch from regions other than the refilled crevice regions 39 and 53. This can then be followed by a thermal anneal to diffuse the n+ dopants into regions 53 and 39. The n+ polysilicon contacts formed in regions 53 and 39 are called Buried Lateral Contacts. As can be seen from FIG. 4G, the Buried Lateral Contacts allows the trench transistor to be connected to the trench capacitor and to the polysilicon bitline in an efficient and compact manner.

8. Oxide 55 is etched away, and gate oxide 46 plus insulating oxide 56 thermally grown; gate oxide 46 is grown to a thickness of 250A, and oxide 56 is, consequently, somewhat thicker because it is simultaneously rown on n+ doped polysilicon 50. Lastly, 7000A of n+ polysilicon is deposited by LPCVD and patterned and etched to form word lines 14. see FIG. 3 for the completed cell. Note that gate 16 (the portion of word line 14 opposite channel 44) controls all of channel 44 despite the thickness of oxide 56 because n region 48, which forms the source for transistor 18, is formed by a diffusion of dopants from polysilicon 50 through polysilicon region 49 and thus extends into epilayer 34 vertically from region 49 as well as horizontally. This vertical diffusion extends sufficiently so that gate 16 will control all of channel 44.

Many modifications of the preferred embodiments are available which still fall within the scope of the invention in that such modifications, either singly or in combinations, do not disrupt the storage of signal charge by the capacitor nor the on/off function of the transistor. Such modifications include the following:

The trench cross section could be whatever shape is convenient, such as circular, retangular, arbitrary convex, corrugated, even multiconnected (i.e. involving multiple trenches) and could even vary along the vertical, continuously or in steps or both. Similarly, the trench sidewalls need not be veritcal, rather any geometry that can be processed should work to a greater or lesser extent, such as bulging, tapered, and sloped sidewalls; indeed, and simply connected trench is functionally equivalent to the parallelepiped of the preferred embodiment. Lastly, the dimensions of the trench (depth, cross sectional area, diameter, and so forth) may be varied but in practice are a tradeoff of process convenience, capacitance required, substrate area, and so forth. Of course, the capacitance required depends upon the refresh time, transistor leakage current, supply voltage, soft error immunity, capacitor leakage current, et cetera.

The capacitor insulator can be of any convenient material such as oxide, nitride, oxide-nitride, oxide-nitride-oxide, and other stack combinations, and the oxide could be thermally grown, LPCVD, grown dry or in steam, and so forth. The thickness of the insulator is a tradeoff of process convenience, insulator realibility, dielectric constant, breakdown voltage, and so forth and may vary widely. Of course, if the cell and array are fabricated in semiconductor material other than silicon (such as gallium arsenide, aluminum gallium arsenide, mercury cadmium telluride, germanium, indium phosphide, and so forth), the capacitor insulator will be a corresponding material. Also, for the capacitor formed by a reverse biased junction, the doping profiles may be varied, the choice will be a tradeoff of process convenience, cell size, capacitor performance, and so forth. Similarly, amorphous silicon could be used in place of polysilicon, and the etch back to form the crevices may be wet or dry (plasma).

The transistor can be formed to operate with a variety of threshold voltages by adjusting the threshold voltage (such as by a shallow diffusion on the channel just prior to gate oxide growth or deposition). The doping levels and the doping species can be varied so as to vary the transistor characteristics; note that the transistor channel length is determined approximately by trench depth and channel width is roughly equal to the trench perimeter and that n-channel and p-channel devices require oppositely doped regions. The transistor gate may be polysilicon, metal, silicide, and so forth. All of these variations affect performance of the transistor but are acceptable if the transistor adequately performs as a pass transistor for the cell in view of the other characteristics of the cell including required read and write times, the capacitance, the refresh time, an so forth.

Figure 5A:
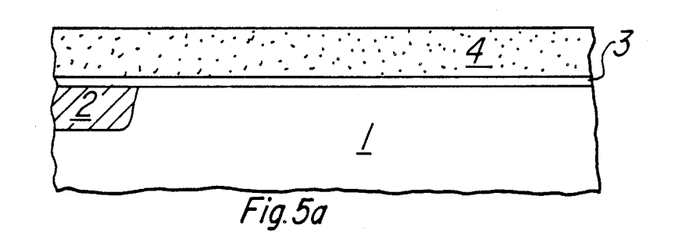
FIGS. 5A through 5F illustrate a sequence of process steps for fabricating another embodiment of the present invention.
Figure 5B:
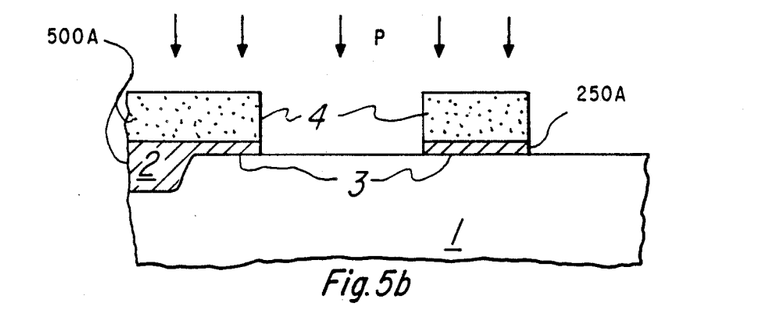
Figure 5C:
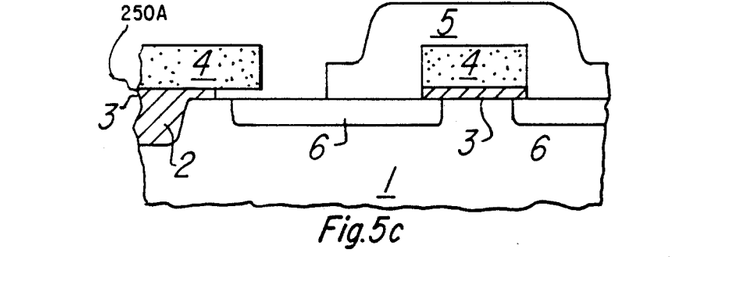

FIG. 5A is a sideview schematic diagram depicting the initial processing steps for fabricating an interconnect which is another embodiment of the present invention. Field isolation region 2 is formed to a thickness of approximately 1,000 angstroms in substrate 1 using techniques widely known in the art. Thin oxide layer 3 is formed on the surface of substrate 1 to a thickness of approximately 250 angstroms using thermal oxidation as is well known in the prior art. Polycrystalline silicon layer 4 is formed on the surface of silicon dioxide layer 3 to a thickness of approximately 5,000 angstroms using chemical vapor deposition. Polycrystalline silicon layer 4 and silicon dioxide layer 3 are then patterned and etched using photolithographic techniques well known in the art. Polycrystalline silicon layer 4 provides an implantation mask for an ion implantation of, for example, phosphorous ions having an energy of approximately 50 kiloelectron volts in a density of approximately $1 \times 10^{15}$ ions per centimeter squared. This ion implantation forms source drain regions 6 as shown in FIG. 5C. A protective mask of photoresist is then formed over portions of polycrystalline silicon layer 4 and silicon dioxide layer 3. This photoresist layer 5 serves as an etch mask. The structure of FIG. 5C is then subjected to a wet etching solution which is highly selective to silicon dioxide such as a wet etch of approximately 10 percent hydrofluoric acid.

Figure 5D:
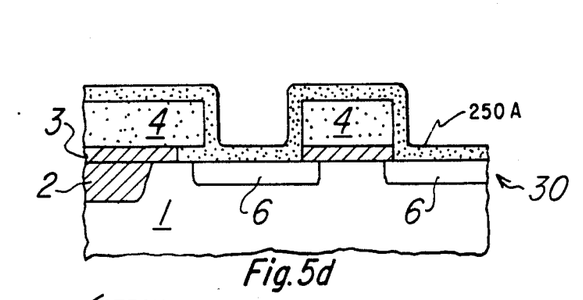
Figure 5E:
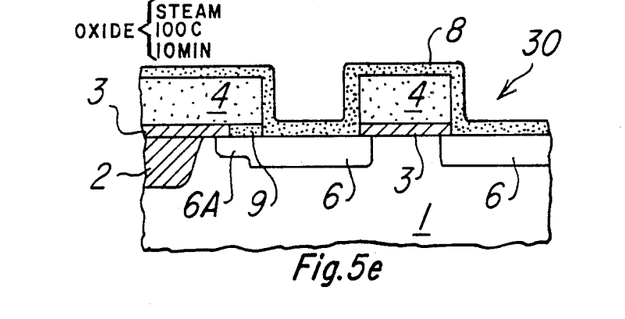

In order for photoresist layer 5 to withstand the undercut etch, photoresist layer 5 must be heat treated or treated using ultra violet light to harden it. For example, using Shippley 1400-27 photoresist, the photoresist must be exposed to deep UV and annealed at 160° C. for approximately 30 minutes to provide the appropriate hardening. Photoresist layer 5 is then removed using techniques well known in the art. A 250 angstrom thick layer of polycrystalline silicon 7 is then conformally deposited using chemical vapor deposition as shown in FIG. 5D. Of importance, this conformal deposition fills the region left void by undercutting silicon dioxide layer 3 under polycrystalline silicon layer 4. Polycrystalline silicon layer 7 is then subjected to a thermal oxidation at approximately −900° C. in a stream ambient for approximately 10 minutes. This thermal oxidation provides silicon dioxide layer 8 as shown in FIG. 5E but does not oxidize poly crystalline silicon plug 9 as shown in FIG. 5E. During this oxidation, the dopants in poly crystalline silicon layer 4 diffuse through the poly crystalline silicon plug 9 and form the portion of source drain layer 6 labeled 6A. This diffusion ensures positive ohmic contact to the source drain regions and avoids shorting poly crystalline silicon layer 4 to substrate 1.

Figure 5F:
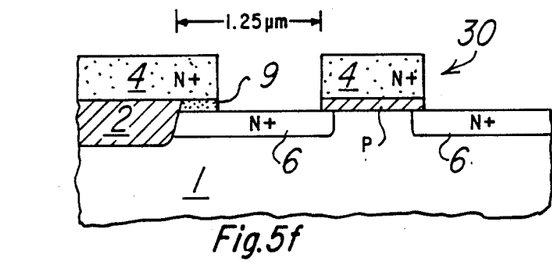

FIG. 5F is a sideview schematic diagram showing the structure of FIG. 5E with silicon dioxide layer 8 removed. This structure should be compared with the structure of FIG. 2 showing that the structure of FIG. 5F requires approximately half of the lateral spacing of the structure of FIG. 2. With a one micron minimum lithography, a spacing of approximately 1.25 micron between the two portions of poly crystalline silicon layer 4 is required to provide an interconnect and a gate for field effect transistor 10. This spacing is required by the 1 micron minimum lithography spacing between the two portions of poly crystalline silicon layer 4 and the 0.25 micron registration tolerance required. Thus, the present embodiment of the invention provides an interconnection using a minimum of surface area of the integrated circuit device.

Although specific embodiments of the present invention are described herein, this is not to be construed as limiting the scope of the claimed invention. The invention is limited only by the appended claims.

We claim:

1. A method for forming an interconnection in an integrated circuit comprising the steps of:

providing a semiconductive substrate of a first conductivity type;
   forming a cavity in said substrate;
   forming an insulating layer on the walls of said cavity;
   forming a conductive layer on said insulating layer;
   forming a crevice between said conductive layer and said substrate by removing a portion of said insulating layer between said substrate and said conductive layer; and
   filling said crevice with a conductive contacting material.

2. The method of claim 1 further comprising forming a region of a second conductivity type in said substrate adjacent to said conductivde contacting material.

3. A method as in claim 1 wherein said removed portion of said insulating layer is removed by liquid chemical etching.

4. A method as in claim 1 wherein said conductive material is polycrystalline silicon deposited by conformal deposition.

5. A method as in claim 4 wherein said conformal deposition is chemical vapor deposition.

6. A method as in claim 2 wherein said region of a second conductivity is formed by diffusion of dopant atoms from said conductive layer through said conductive contacting material into said substrate.

* * * * *